US011678445B2

(12) United States Patent
Prest et al.

(10) Patent No.: US 11,678,445 B2
(45) Date of Patent: Jun. 13, 2023

(54) SPATIAL COMPOSITES

(71) Applicant: Apple Inc., Cupertino, CA (US)

(72) Inventors: Christopher D. Prest, San Francisco, CA (US); Stephen B. Lynch, Portola Valley, CA (US); Teodor Dabov, Los Angeles, CA (US)

(73) Assignee: APPLE INC., Cupertino, CA (US)

( * ) Notice: Subject to any disclaimer, the term of this patent is extended or adjusted under 35 U.S.C. 154(b) by 106 days.

(21) Appl. No.: 15/716,086

(22) Filed: Sep. 26, 2017

(65) Prior Publication Data

US 2018/0213660 A1    Jul. 26, 2018

Related U.S. Application Data

(60) Provisional application No. 62/450,530, filed on Jan. 25, 2017.

(51) Int. Cl.
*H05K 5/02*     (2006.01)
*B29C 33/38*    (2006.01)
(Continued)

(52) U.S. Cl.
CPC .......... *H05K 5/0217* (2013.01); *B22D 19/04* (2013.01); *B22D 19/14* (2013.01); *B29C 33/38* (2013.01); *B29C 35/02* (2013.01); *B29C 45/14311* (2013.01); *B29C 70/72* (2013.01); *H05K 5/0208* (2013.01); *B29C 2035/0827* (2013.01);
(Continued)

(58) Field of Classification Search
CPC ..... B44C 1/28; H04M 1/0283; H05K 5/0243; H05K 5/0217; Y10T 428/24355; Y10T 428/25; Y10T 428/24802; Y10T 428/24893; Y10T 428/1471; Y10T 428/2982; Y10T 428/22; Y10T 428/23921; Y10T 428/24736; Y10T 428/29
See application file for complete search history.

(56) References Cited

U.S. PATENT DOCUMENTS 4,106,839 A    8/1978  Cooper
4,256,412 A    3/1981  Tybus et al.
(Continued)

FOREIGN PATENT DOCUMENTS

CN    101087500    12/2007
CN    102159045    8/2011
(Continued)

OTHER PUBLICATIONS

International Search Report and Written Opinion, PCT/US2018/015091, 13 pages, dated Apr. 17, 2018.
(Continued)

*Primary Examiner* — Laura A Auer
(74) *Attorney, Agent, or Firm* — Brownstein Hyatt Farber Schreck, LLP

(57) ABSTRACT

A housing of an electronic device includes a substrate defining an external surface and internal surface of the housing, at least one sidewall extending from the substrate, and abrasion-resistant members at least partly embedded in the substrate and extending beyond the external surface. The abrasion-resistant members may be formed from metal or ceramic. The substrate comprises a moldable matrix. The abrasion-resistant members are harder than the moldable matrix.

15 Claims, 11 Drawing Sheets

(51) Int. Cl.
*B29C 35/02* (2006.01)
*B22D 19/14* (2006.01)
*B29C 70/72* (2006.01)
*B29C 45/14* (2006.01)
*B22D 19/04* (2006.01)
*H04M 1/02* (2006.01)
*H05K 5/04* (2006.01)
*H05K 5/00* (2006.01)
*B29L 31/34* (2006.01)
*B29K 105/16* (2006.01)
*B29C 35/08* (2006.01)

(52) U.S. Cl.
CPC .. *B29C 2035/0877* (2013.01); *B29K 2105/16* (2013.01); *B29L 2031/3437* (2013.01); *B29L 2031/3481* (2013.01); *H04M 1/0202* (2013.01); *H05K 5/0086* (2013.01); *H05K 5/04* (2013.01)

(56) References Cited

U.S. PATENT DOCUMENTS

| | | | |
|---|---|---|---|
| 4,855,174 A * | 8/1989 | Kawamoto | B65D 90/06 428/67 |
| 4,989,622 A | 2/1991 | Kozuka et al. | |
| 5,055,347 A | 10/1991 | Bacon, Jr. | |
| 5,512,374 A | 4/1996 | Wallace et al. | |
| 6,061,104 A | 5/2000 | Evanicky et al. | |
| 6,093,887 A | 7/2000 | Ponto et al. | |
| 6,189,938 B1 | 2/2001 | Nakadaira et al. | |
| 6,278,873 B1 | 8/2001 | Itakura et al. | |
| 6,288,330 B1 | 9/2001 | Chen | |
| 6,359,768 B1 | 3/2002 | Eversley et al. | |
| 6,392,873 B1 | 5/2002 | Honda | |
| 6,424,338 B1 | 7/2002 | Anderson et al. | |
| 6,442,826 B1 | 9/2002 | Staudt et al. | |
| 6,473,069 B1 | 10/2002 | Gerpheide | |
| 6,483,024 B1 | 11/2002 | Smithson et al. | |
| 6,589,891 B1 | 7/2003 | Rast | |
| 6,654,256 B2 | 11/2003 | Gough | |
| 6,671,160 B2 | 12/2003 | Hayden | |
| 6,940,731 B2 | 9/2005 | Davis et al. | |
| 6,996,425 B2 | 2/2006 | Watanabe | |
| 7,048,242 B2 | 5/2006 | Oddsen, Jr. | |
| 7,436,653 B2 | 10/2008 | Yang et al. | |
| 7,491,900 B1 | 2/2009 | Peets et al. | |
| 7,586,753 B2 | 9/2009 | Lu | |
| 7,604,377 B2 | 10/2009 | Yu et al. | |
| 7,755,913 B2 | 7/2010 | He | |
| 7,829,812 B2 | 11/2010 | Tolbert et al. | |
| 7,920,904 B2 | 4/2011 | Kim et al. | |
| 7,986,525 B2 | 7/2011 | Wang | |
| 8,066,233 B2 | 11/2011 | Fujikawa et al. | |
| 8,164,898 B2 | 4/2012 | Lin et al. | |
| D660,193 S | 5/2012 | Neuner | |
| 8,195,244 B2 | 6/2012 | Smoyer et al. | |
| 8,199,488 B2 | 6/2012 | Zou et al. | |
| 8,358,513 B2 | 1/2013 | Kim et al. | |
| 8,396,521 B2 | 3/2013 | Horimoto et al. | |
| 8,456,847 B2 | 6/2013 | Hwang et al. | |
| 8,509,863 B2 | 8/2013 | Vedurmudi et al. | |
| 8,553,907 B2 | 10/2013 | Thomason et al. | |
| 8,558,977 B2 | 10/2013 | Gettemy et al. | |
| 8,587,935 B2 | 11/2013 | Lee | |
| 8,654,524 B2 | 2/2014 | Pance et al. | |
| 8,665,236 B2 | 3/2014 | Myers | |
| 8,675,359 B2 | 3/2014 | Chen | |
| 8,681,115 B2 | 3/2014 | Kurita | |
| 8,744,529 B2 | 6/2014 | Freund et al. | |
| 8,773,848 B2 | 7/2014 | Russell-Clarke et al. | |
| 8,824,140 B2 | 9/2014 | Prest et al. | |
| 8,974,924 B2 | 3/2015 | Weber et al. | |
| 8,975,540 B2 | 3/2015 | Mareno et al. | |
| 9,007,748 B2 | 4/2015 | Jarvis | |
| 9,086,748 B2 | 7/2015 | Nam et al. | |
| 9,124,676 B2 | 9/2015 | Allore et al. | |
| 9,135,944 B2 | 9/2015 | Jenks | |
| 9,162,519 B2 | 10/2015 | Suehiro et al. | |
| 9,173,306 B2 | 10/2015 | Lim et al. | |
| 9,192,072 B2 | 11/2015 | Shin et al. | |
| 9,203,463 B2 | 12/2015 | Asrani et al. | |
| 9,218,116 B2 | 12/2015 | Benko et al. | |
| 9,390,869 B2 | 7/2016 | Lee et al. | |
| 9,429,997 B2 | 8/2016 | Myers et al. | |
| 9,448,631 B2 | 9/2016 | Winter et al. | |
| 9,489,054 B1 | 11/2016 | Sumsion et al. | |
| 9,532,723 B2 | 1/2017 | Kim et al. | |
| 9,621,218 B1 | 4/2017 | Glickman et al. | |
| 9,642,241 B2 | 5/2017 | Huitema et al. | |
| 9,654,164 B2 | 5/2017 | Irei et al. | |
| 9,740,237 B2 | 8/2017 | Moore et al. | |
| 9,804,635 B2 | 10/2017 | Kim et al. | |
| 9,898,903 B2 | 2/2018 | Khoshkava et al. | |
| 9,955,603 B2 | 4/2018 | Kiple et al. | |
| 10,013,075 B2 | 7/2018 | Shipman | |
| 10,042,442 B2 | 8/2018 | Kwak | |
| 10,110,267 B2 | 10/2018 | Kim et al. | |
| 10,321,590 B2 | 6/2019 | Cater et al. | |
| 10,468,753 B2 | 11/2019 | Kim et al. | |
| 10,705,570 B2 | 7/2020 | Kuna et al. | |
| 11,379,010 B2 | 7/2022 | Kuna et al. | |
| 2002/0006687 A1 | 1/2002 | Lam | |
| 2002/0072335 A1 | 6/2002 | Watanabe | |
| 2002/0130981 A1 | 9/2002 | Ma et al. | |
| 2004/0190239 A1 | 9/2004 | Weng | |
| 2005/0140565 A1 | 6/2005 | Krombach | |
| 2006/0110599 A1 * | 5/2006 | Honma | B32B 5/10 428/413 |
| 2006/0203124 A1 | 9/2006 | Park et al. | |
| 2007/0195495 A1 | 8/2007 | Kim et al. | |
| 2007/0229702 A1 | 10/2007 | Shirono et al. | |
| 2007/0287512 A1 | 12/2007 | Kilpi et al. | |
| 2008/0018475 A1 | 1/2008 | Breed et al. | |
| 2008/0084384 A1 | 4/2008 | Gregorio et al. | |
| 2008/0174037 A1 * | 7/2008 | Chen | B44C 1/28 264/40.1 |
| 2009/0003141 A1 | 1/2009 | Ozawa et al. | |
| 2009/0041984 A1 | 2/2009 | Mayers et al. | |
| 2009/0175020 A1 * | 7/2009 | Zadesky | G06F 1/1626 361/818 |
| 2010/0105452 A1 | 4/2010 | Shin et al. | |
| 2010/0137043 A1 | 6/2010 | Horimoto et al. | |
| 2010/0151925 A1 | 6/2010 | Vedurmudi et al. | |
| 2010/0157515 A1 | 6/2010 | Tseng et al. | |
| 2010/0265182 A1 | 10/2010 | Ball et al. | |
| 2010/0302016 A1 | 12/2010 | Zaborowski et al. | |
| 2010/0315399 A1 | 12/2010 | Jacobson et al. | |
| 2011/0038114 A1 | 2/2011 | Pance et al. | |
| 2011/0047459 A1 | 2/2011 | Van Der Westhuizen | |
| 2011/0065479 A1 | 3/2011 | Nader | |
| 2011/0091051 A1 | 4/2011 | Thomason et al. | |
| 2011/0095994 A1 | 4/2011 | Birnbaum | |
| 2011/0205169 A1 | 8/2011 | Yasutake et al. | |
| 2012/0088072 A1 * | 4/2012 | Pawloski | B29C 70/58 428/143 |
| 2012/0094594 A1 | 4/2012 | Rofougaran et al. | |
| 2012/0175165 A1 | 7/2012 | Merz et al. | |
| 2012/0212424 A1 | 8/2012 | Sharma et al. | |
| 2012/0236477 A1 | 9/2012 | Weber | |
| 2012/0268412 A1 | 10/2012 | Cruz-Hernandez et al. | |
| 2012/0274575 A1 | 11/2012 | Solomon et al. | |
| 2013/0051000 A1 | 2/2013 | Yu et al. | |
| 2013/0273295 A1 | 10/2013 | Kenney et al. | |
| 2013/0308282 A1 | 11/2013 | Shin et al. | |
| 2013/0323579 A1 * | 12/2013 | Hwang | H01M 2/0404 429/175 |
| 2014/0015773 A1 | 1/2014 | Loeffler | |
| 2014/0084770 A1 | 3/2014 | Tsai et al. | |
| 2014/0091688 A1 | 4/2014 | Narajowski et al. | |
| 2014/0288438 A1 | 9/2014 | Venkatraman et al. | |
| 2014/0347799 A1 | 11/2014 | Ono et al. | |
| 2014/0368455 A1 | 12/2014 | Croisonnier et al. | |
| 2015/0001104 A1 * | 1/2015 | Kim | B65D 81/022 206/37 |

(56) References Cited

U.S. PATENT DOCUMENTS

| | | |
|---|---|---|
| 2015/0062419 A1 | 3/2015 | Hooton et al. |
| 2015/0090571 A1 | 4/2015 | Leong et al. |
| 2015/0109223 A1 | 4/2015 | Kessler et al. |
| 2015/0124401 A1 | 5/2015 | Prest et al. |
| 2015/0171916 A1 | 6/2015 | Asrani et al. |
| 2015/0183185 A1 | 7/2015 | Chang |
| 2015/0185946 A1 | 7/2015 | Fourie |
| 2015/0255853 A1 | 9/2015 | Kwong et al. |
| 2016/0029899 A1 | 2/2016 | Kim et al. |
| 2016/0055729 A1 | 2/2016 | Maddox et al. |
| 2016/0064820 A1 | 3/2016 | Kim et al. |
| 2016/0098016 A1 | 4/2016 | Ely et al. |
| 2016/0098107 A1 | 4/2016 | Morrell et al. |
| 2016/0103544 A1 | 4/2016 | Filiz et al. |
| 2016/0147257 A1 | 5/2016 | Yamazaki |
| 2016/0255944 A1 | 9/2016 | Baranski et al. |
| 2016/0270247 A1 | 9/2016 | Jones et al. |
| 2016/0308563 A1 | 10/2016 | Ouyang et al. |
| 2016/0316574 A1 | 10/2016 | Chang et al. |
| 2016/0327980 A1 | 11/2016 | Farahani et al. |
| 2016/0327986 A1 | 11/2016 | Farahani et al. |
| 2017/0010771 A1 | 1/2017 | Bernstein et al. |
| 2017/0038793 A1 | 2/2017 | Kallman |
| 2017/0048495 A1 | 2/2017 | Scalisi et al. |
| 2017/0230073 A1 | 8/2017 | Youn et al. |
| 2017/0264722 A1 | 9/2017 | Zhong |
| 2017/0303048 A1 | 10/2017 | Hooton et al. |
| 2018/0020208 A1 | 1/2018 | Woo et al. |
| 2018/0026341 A1 | 1/2018 | Mow et al. |
| 2018/0026353 A1 | 1/2018 | Tseng et al. |
| 2018/0077328 A1 | 3/2018 | Park et al. |
| 2018/0210515 A1 | 7/2018 | Lyles et al. |
| 2018/0217668 A1 | 8/2018 | Ligtenberg et al. |
| 2018/0217669 A1 | 8/2018 | Ligtenberg et al. |
| 2018/0218859 A1 | 8/2018 | Ligtenberg et al. |
| 2018/0284845 A1 | 10/2018 | Honma et al. |
| 2019/0083715 A1 | 3/2019 | Redmond et al. |
| 2019/0101960 A1 | 4/2019 | Silvanto et al. |
| 2019/0128669 A1 | 5/2019 | Nobayashi et al. |
| 2019/0361543 A1 | 11/2019 | Zhang |
| 2019/0377385 A1 | 12/2019 | Bushnell |
| 2020/0057525 A1 | 2/2020 | Prest et al. |
| 2020/0076056 A1 | 3/2020 | Froese et al. |
| 2020/0076057 A1 | 3/2020 | Leutheuser et al. |
| 2020/0076058 A1 | 3/2020 | Zhang et al. |
| 2020/0409023 A1 | 12/2020 | Kazuo et al. |
| 2021/0149458 A1 | 5/2021 | Silvanto et al. |
| 2021/0234403 A1 | 7/2021 | Ku et al. |
| 2021/0353226 A1 | 11/2021 | Hiemstra et al. |
| 2022/0004837 A1 | 1/2022 | Perkins et al. |
| 2022/0006176 A1 | 1/2022 | Froese et al. |
| 2022/0057885 A1 | 2/2022 | Prest et al. |
| 2022/0059928 A1 | 2/2022 | Leutheuser et al. |
| 2022/0317740 A1 | 10/2022 | Kuna et al. |
| 2022/0326777 A1 | 10/2022 | Ligtenberg et al. |

FOREIGN PATENT DOCUMENTS

| | | |
|---|---|---|
| CN | 202281978 | 6/2012 |
| CN | 102984904 | 3/2013 |
| CN | 103168280 | 6/2013 |
| CN | 203054674 | 7/2013 |
| CN | 103390793 | 11/2013 |
| CN | 203416294 | 1/2014 |
| CN | 103681061 | 3/2014 |
| CN | 104742308 | 7/2015 |
| CN | 105228966 | 1/2016 |
| CN | 107221506 | 9/2017 |
| CN | 107275751 | 10/2017 |
| CN | 107735903 | 2/2018 |
| CN | 207216299 | 4/2018 |
| CN | 108400425 | 8/2018 |
| CN | 108594622 | 9/2018 |
| CN | 108594623 | 9/2018 |
| CN | 112532263 | 3/2021 |
| CN | 112799294 | 5/2021 |
| EP | 2565742 | 3/2013 |
| EP | 2843501 | 3/2015 |
| EP | 2993730 | 3/2016 |
| EP | 3144768 | 3/2017 |
| EP | 3438786 | 2/2019 |
| GB | 2516439 | 1/2015 |
| GB | 2529885 | 3/2016 |
| JP | S58151619 | 9/1983 |
| JP | H61039144 | 2/1986 |
| JP | H10102265 | 4/1998 |
| JP | 2001216077 | 8/2001 |
| JP | 20023431 | 11/2002 |
| JP | 2004272690 | 9/2004 |
| JP | 2006243812 | 9/2006 |
| JP | 2007072375 | 3/2007 |
| JP | 2011014149 | 1/2011 |
| JP | 2011159276 | 8/2011 |
| JP | 2011239139 | 11/2011 |
| JP | 2011248888 | 12/2011 |
| JP | 2012027592 | 2/2012 |
| JP | 2012222553 | 11/2012 |
| JP | 2013508818 | 3/2013 |
| JP | 2014501070 | 1/2014 |
| JP | 2014512879 | 5/2014 |
| JP | 2014186075 | 10/2014 |
| JP | 2015031952 | 2/2015 |
| KR | 20110049416 | 5/2011 |
| KR | 20130096048 | 8/2013 |
| KR | 20150012312 | 2/2015 |
| KR | 20160019833 | 2/2016 |
| KR | 20160052275 | 5/2016 |
| KR | 20160134504 | 11/2016 |
| KR | 20180025126 | 3/2018 |
| TW | 201129285 | 8/2011 |
| TW | 201532835 | 9/2015 |
| TW | 201701119 | 1/2017 |
| WO | WO2009/002605 | 12/2008 |
| WO | WO2009/049331 | 4/2009 |
| WO | WO2009/129123 | 10/2009 |
| WO | WO2012/129247 | 9/2012 |
| WO | WO2014/037945 | 3/2014 |
| WO | WO2015/153701 | 10/2015 |
| WO | WO2016/039803 | 3/2016 |
| WO | WO2016/053901 | 4/2016 |
| WO | WO2018/013573 | 1/2018 |
| WO | WO2018/142132 | 8/2018 |

OTHER PUBLICATIONS

Author Unknown, "Improved Touchscreen Products," Research Disclosure, Kenneth Mason Publications, Hampshire, UK, GB, vol. 428, No. 53, Dec. 1, 1999.

Kim et al., "Ultrathin Cross-Linked Perfluoropolyether Film Coatings from Liquid $CO_2$ and Subsequent UV Curing," Chem. Matter, vol. 22, pp. 2411-2413, 2010.

Author Unknown, "Smart Watch—New Fashion Men/women Bluetooth Touch Screen Smart Watch Wrist Wrap Watch Phone," https://www.fargoshopping.co.ke/, 5 pages, Mar. 2016.

* cited by examiner

SPATIAL COMPOSITES

This application is a nonprovisional patent application of and claims the benefit of U.S. Provisional Patent Application No. 62/450,530, filed Jan. 25, 2017 and titled "Spatial Composites," the disclosure of which is hereby incorporated herein by reference in its entirety.

FIELD

Embodiments described herein relate generally to abrasion-resistant surfaces for electronic devices, and more particularly to incorporating abrasion-resistant elements into material of a housing to form abrasion-resistant surfaces.

BACKGROUND

Electronic devices are ubiquitous in society and can be found in everything from wristwatches to computers. Such electronic devices, especially portable electronic devices such as handheld mobile phones, watches, and tablet computers, can experience contact with various surfaces that leads to marring, or abrasion, of the surface of the device. Housing materials for such devices may have different combinations of properties relating to strength, appearance, abrasion resistance, electromagnetic shielding, and the like. For example, metal housings may be strong and relatively scratch resistant, but may provide undesirable electromagnetic shielding. Plastic may have better electromagnetic shielding properties than metal, but may be less scratch or abrasion-resistant. Other materials may provide different combinations of properties.

SUMMARY

A housing of an electronic device includes a substrate defining an external surface and internal surface of the housing, at least one sidewall extending from the substrate, and abrasion-resistant members at least partly embedded in the substrate and extending beyond the external surface.

The abrasion-resistant members are formed from metal or ceramic. The substrate may comprise a moldable matrix. The abrasion-resistant members are harder than the moldable matrix. An average distance between the adjacent abrasion-resistant members is between about 10 and 100 microns.

The abrasion-resistant members each may have a faceted surface. The abrasion-resistant members may be configured to reflect light at an angle. The substrate may have a Young's modulus greater than, or equal to about 5 GPa. The beads may have a diameter between 0.5 and 5 mm.

A housing of an electronic device including a housing structure defining an external surface and internal surface of the housing, at least one sidewall extending from the external surface, and beads having interlocking features and being at least partially embedded in the housing structure, such that the interlocking features mechanically engage the housing structure and portions of the beads protrude above the external surface. The beads are distributed in a regular pattern over a first portion of the external surface. A second portion of the external surface may be substantially free of beads. The second portion of the external surface corresponds to a location of an antenna within the housing.

The housing structure may comprise a moldable material. The beads may comprise a hard material embedded within at least a portion of the moldable material. A hardness of the hard material is greater than a hardness of the moldable material.

The moldable material may be a polymer. The moldable material may be an amorphous metal. The beads may each have a faceted surface, such that a portion of the housing structure having the beads at least partially embedded therein produces a specular reflection. The interlocking features include at least one of through-holes, flanges, or indentations. The interlocking features may comprise connecting elements joining at least a subset of the beads to one another. The subset of the beads and the connecting elements are a monolithic structure.

A method for producing an abrasion-resistant housing of an electronic device including disposing abrasion-resistant components with interlocking structures in a mold cavity having a shape corresponding to a housing of an electronic device, introducing a moldable material into the mold cavity, thereby at least partially encapsulating the interlocking structures while maintaining a portion of the abrasion-resistant components outside of the moldable material, and curing the moldable material, thereby engaging the cured moldable material with the interlocking structures and forming the housing. The interlocking structures may include at least one of holes, meshes, swages, and undercuts.

The method may further include, after the curing, forming a facet on at least a subset of the plurality of the abrasion-resistant components such that an external surface of the housing produces a visual effect visible from at least an orientation. The method may further include the portion of the abrasion-resistant components is a first portion. The first portion may extend above an external surface of the housing, and the abrasion-resistant components may extend through the moldable material such that a second portion of the abrasion-resistant components mechanically engages with an internal surface of the housing.

The interlocking structures may comprise a plurality of connection elements joining a plurality of the abrasion-resistant components. Introducing the moldable material may comprise encapsulating the connection elements within the moldable material.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Figure 1:
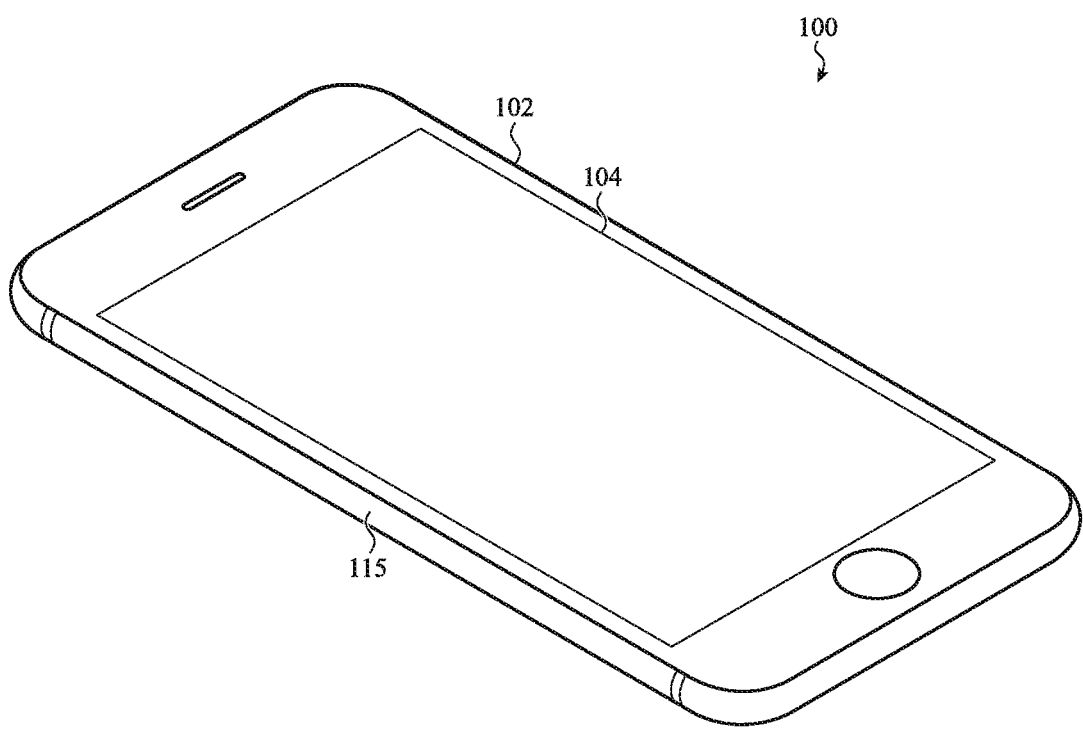
FIG. 1 shows an example electronic device.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

Housings or enclosures for electronic devices may be manufactured from various materials, such as plastics, metals, ceramics, or the like. Different materials provide advantages for certain applications. For example, metal housings may be particularly resistant to dents, scratches or breakage, but may interfere with radio signals entering or emanating from the device. Ceramic housings may be scratch resistant and transparent to radio signals, but may be brittle. Plastic housings may be transparent to radio signals and fairly strong, but may be prone to scratches or dents. In some products, it is useful to provide housings which are abrasion-resistant, e.g., not readily scratched or marred when they come into contact with hard or sharp surfaces such as keys, coins, sand, debris, or other objects. The incorporation of abrasion-resistant members may increase the impact and dent resistance of the housings.

Described herein are housings that include abrasion-resistant materials or members that are embedded in, or otherwise affixed to, the housing. Such housings may exhibit a desirable balance of properties, such as strength (e.g., toughness, shatter resistance, yield strength), appearance, radio transparency, and scratch or abrasion resistance. For example, a housing may include a plastic material that forms structural walls of the housing, and abrasion-resistant members composed of metals, glasses, ceramics, or other suitable materials may be embedded in the plastic material and may extend above a top surface of the plastic material. The abrasion-resistant members may be harder than the plastic housing structure, and as such may improve the abrasion resistance of the housing as a whole. Accordingly, the housing may be more scratch resistant than other housings, such as housings with a single material forming the exterior surface.

The abrasion-resistant members (or simply "members") may be formed in a variety of shapes and sizes. For example, the abrasion-resistant members may be spherical, substantially spherical, or faceted. The abrasion-resistant members 210 may be shaped like a bead, or may be substantially bead-like. The members, or beads, may include interlocking structures that mechanically engage the housing structure. The members may also have interconnecting structures that connect the abrasion-resistant members to each other, and may be below the surface of the housing structure. The members may have a range of sizes. For example, the members may have a diameter that is between about 0.5 and about 5.0 mm. Furthermore, the portion of the abrasion-resistant members that protrudes above the surface of the housing structure may be faceted. Such facets may reflect light in certain directions, which may produce a desirable appearance, reflection, image, or color. The facets may be present in the members prior to incorporation into the housing structure, or may be produced in the members by treating the members after the formation of the abrasion-resistant housing structure.

In some cases an entire exterior surface of a housing may have abrasion-resistant members incorporated therein (e.g., the exterior surface of the housing may be substantially uniformly coated with the abrasion-resistant members). In other cases, one or more distinct or differentiated portions of the housing are substantially free of abrasion-resistant materials or members. For example, a region of the housing displaying a logo and/or other indicia may be free of abrasion-resistant members in order to make the logo and/or other indicia visible or more visually distinctive. As another example, a region may be free of abrasion-resistant members so the region is more transparent to or transmissive of electromagnetic radiation, such as radio waves or mobile phone signals, as compared to a region that includes abrasion-resistant members.

Also described herein are techniques for forming abrasion-resistant housings for electronic devices. For example, one method to produce the abrasion-resistant housing structures includes positioning abrasion-resistant components or members having interlocking structures in a mold, introducing a moldable material into the mold such that the moldable material forms around the interlocking structures, thus securing the members to the moldable material to form the housing, and curing the moldable material to securely retain the members in the abrasion-resistant housing. The housings formed according to this method, or others described herein, may be used for electronic devices including mobile phones, watches, tablet computers, music playback devices, laptops, notebooks, or the like.

Although one or more of these components and/or processes may be described in the context of handheld devices, such as mobile phones, laptops, and notebooks, the embodiments disclosed herein should not be interpreted or otherwise used as limiting the scope of the disclosure, including the claims. In addition, one skilled in the art will understand that the following description has broad application. Accordingly, the discussion of any embodiment is meant only to be exemplary and is not intended to suggest that the scope of the disclosure, including the claims, is limited to these embodiments.

FIG. 1 shows an example device 100. The device 100 shown in FIG. 1 is a mobile phone (e.g., a smartphone), but this is merely one representative example of a device that may be used in conjunction with the ideas disclosed herein. Other example devices include, without limitation, music/media players, tablet computers, laptop computers, wearable electronic devices, watches (e.g., mechanical, electrical, or electromechanical), and the like.

The electronic device 100 includes a housing 102 and a cover 104, such as a glass, plastic, or other substantially transparent material, component, or assembly, attached to the housing 102. The housing 102 includes side walls 115 and a back panel 205 (FIG. 2A), which together may substantially define a back surface and four exterior side surfaces of the electronic device 100. The cover 104 may cover or otherwise overlie a display and/or a touch sensitive surface (e.g., a touchscreen) of the device 100, and may define a front exterior surface of the device 100. The housing 102 and the cover 104 may be secured together and may substantially define the entire exterior of the device 100.

The device 100 may also include internal components, such as processors, memory, circuit boards, batteries, sensors, and the like. Such components may be disposed within an internal volume defined at least partially by the housing 102, and may be affixed to the housing 102 via internal surfaces, attachment features, threaded connectors, studs, posts, or the like, that are formed into, defined by, or otherwise part of the housing 102 (and/or the cover 104).

The housing 102 may be formed from or include any suitable material or combination of materials. As described herein, the housing 102 may include abrasion-resistant members embedded in a matrix. The matrix may be formed from or include plastic, glass, polymer, ceramic, metal, or the like. The abrasion-resistant members, described herein, may be formed from or include ceramic, metal, glass, or the like. The housing 102 may be a single unitary component (e.g., a single monolithic structure, with or without embedded abrasion-resistant members). In other cases, the housing 102 may be formed from multiple components (e.g., multiple unitary housing structures, each of which may include or may omit embedded abrasion-resistant members), such as multiple components fused, bonded, sintered, or otherwise attached to each other. For example, the back panel 205 (FIG. 2A) and one or more of the sidewalls 115 may be distinct components that are joined, bonded, or otherwise secured together to form the housing 102.

Figure 2A:
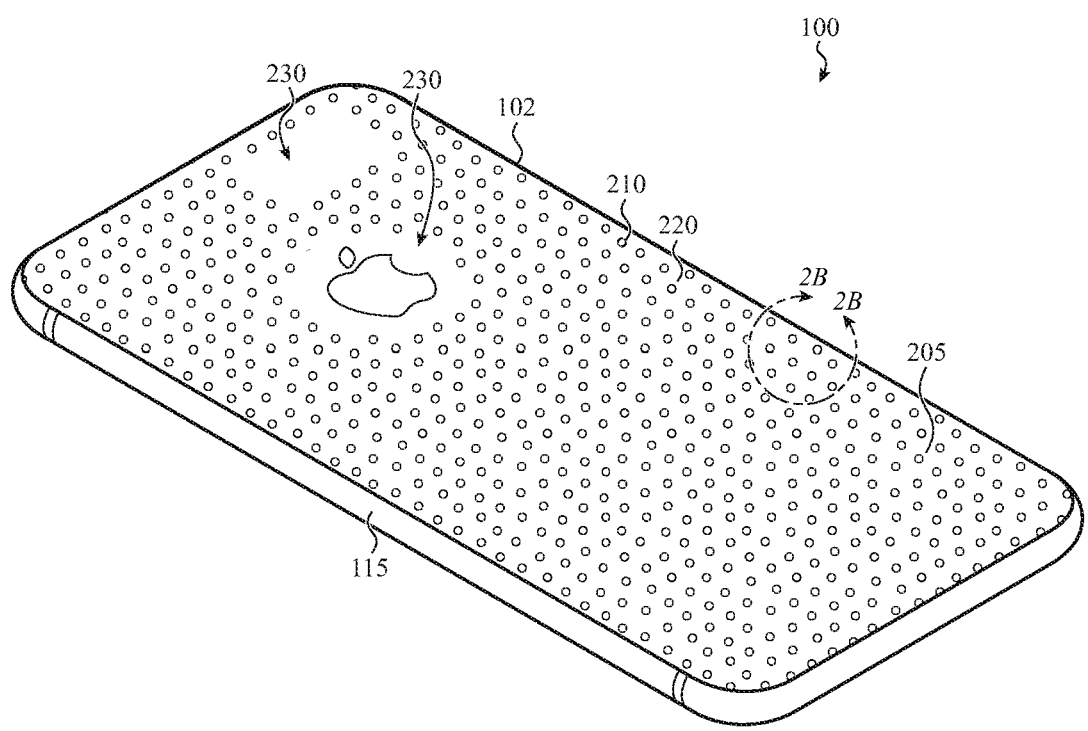
FIG. 2A shows the back of the electronic device of FIG. 1.

FIG. 2A shows a back view of the device 100, showing an example of the housing 102 with a plurality of abrasion-resistant members 210 embedded in a material of the back panel 205 of the housing 102. Abrasion-resistant members 210 may also or instead by embedded in one or more sidewalls 115 of the housing 102 (or portions thereof). The device housing 102 shown in FIG. 2A comprises a substrate 220 that defines external and internal surfaces of the housing 100. The housing 102 may also include abrasion-resistant members 210, which may be at least partially embedded in the substrate 220. The abrasion-resistant members 210 may be at least partly embedded in the substrate and may extend (e.g., protrude) beyond the external surface, as shown in FIG. 2C. By protruding beyond the external surface of the housing, the abrasion-resistant members may prevent or reduce scratching of the external surface of the housing.

The substrate 220 may be made of a moldable material such as a polymer, amorphous metal, glass, plastic, acrylic, ultraviolet-cured resin, ceramic or any other suitable material. The polymers may be thermosetting resins and/or thermoplastics. Moldable materials may be introduced into a shaped mold and may mechanically engage with the abrasion-resistant members 210 (e.g., via interlocking structures on the abrasion-resistant members 210) to secure the abrasion-resistant members 210 to the moldable material. In this way, housings may be fabricated in any shape while also exhibiting enhanced scratch resistance.

The abrasion-resistant members 210 (or simply members 210, or beads 210) may be formed of metal, glass, hard plastic, or ceramic, such as zirconia, alumina, silicon carbide, yttria, silicon nitride, or the like. The abrasion-resistant members 210 may be harder than the substrate. For example, the members 210 may have a higher hardness value than does the substrate 220. The abrasion-resistant members 210 may be fabricated by nano-molding techniques, or any other suitable technique or process.

The housing 102, or enclosure, may be substantially rigid (e.g., non-compliant). For example, the housing 102 may be formed from or include a moldable material that is hardened, or cured, into a solid form. For example, the housing may have a Young's modulus greater than or equal to about 1 GPa, 2 GPa, 5 GPa, 7 GPa, or 10 GPa. Accordingly, the substrate, or base material in which the abrasion-resistant members 210 is embedded may be sufficiently stiff to form the housing 102 itself, and may not require additional structural layers, walls, or other housing members in order to form a sufficiently stiff or rigid housing 102.

The surface density of the arrangement of the abrasion-resistant members 210 may vary across the surface of the housing 102. The abrasion-resistant members may be distributed in a random or pseudorandom arrangement, or in an ordered array such as a grid or other non-random pattern. Even though the abrasion-resistant members 210 may be in a random or pseudorandom arrangement, it may be possible to control the average distance between nearest neighbors, such that an average distance between members is between about 10 and about 100 microns, or any other suitable range. The surface density of the abrasion-resistant members 210 may have effect on the stiffness of the housing. A greater surface density of the abrasion-resistant members 210 may increase the stiffness of the housing beyond the inherent stiffness of the substrate material. A lower density of the abrasion-resistant members 210 may permit the housing to be more flexible.

By varying the surface density of abrasion-resistant members 210, it may be possible to tune structural qualities, such as stiffness, hardness, flexibility, and the like. For example, the surface density of the abrasion-resistant members 210 may be increased in regions of the housing, such as the corners or edges (e.g., at a transition between a back and a sidewall of a housing), relative to other areas of the housing. Fracture and impact resistance in the regions of the corners and/or edges may be increased by having a higher density of abrasion-resistant members in those regions. In some embodiments, it may be advantageous to have a reduced surface density of the abrasion-resistant members in some areas of the housing. For example, having a lower surface density of abrasion-resistant members at the corners or edges of the housing (relative to other areas, such as the back of the housing) may increase the stiffness of the corners or edges. In this way, by varying the surface densities of the abrasion-resistant members, different areas of the housing may have different mechanical properties (e.g., different scratch resistance, strength, toughness, stiffness, or the like).

Furthermore, the housing 102 may also have regions 230 that substantially lack abrasion-resistant members 210. In some cases, the regions 230 have no abrasion-resistant members 210. The regions 230 may coincide with or surround areas with logos and/or other indicia, which may increase the visibility or otherwise improve the appearance of the logos and/or other indicia. Also, the regions lacking abrasion-resistant members 230 may be transparent to or transmissive of electromagnetic radiation, such as radio waves, microwaves, and/or mobile phone signals, and may be more transparent to such radiation than the portions of the housing 102 that include the abrasion-resistant members 210. Accordingly, antennas may be positioned inside the housing below or near the regions 230 lacking abrasion-resistant members, such that the antennas can transmit and/or receive wireless signals with less interference, attenuation, or shielding than if abrasion-resistant members 210 were positioned in those regions.

The abrasion-resistant members 210, or beads 210, may be provided in a variety of colors. The colors of the beads 210 may be substantially the same as that of the substrate or they may be of a different color. It may be desirable for the beads 210 to be camouflaged, or to be of contrasting colors. It may be desirable for the entire housing surface to be colored such that the beads are not visible and the entire housing appears to be one material. Furthermore, the beads 210 may be transparent, so that they can function as light pipes. It may be desirable for light to emanate from the beads in the housing.

Figure 2B:
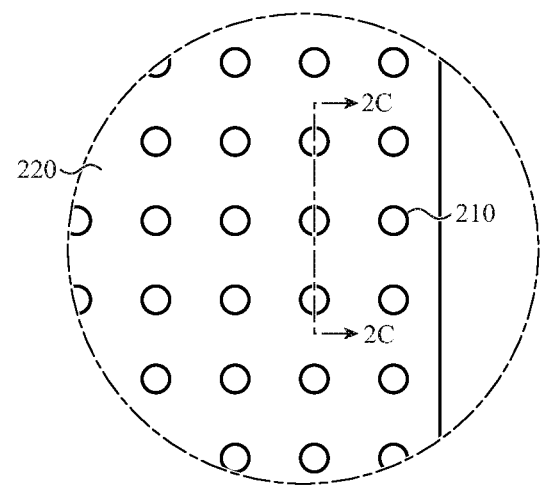
FIG. 2B is a detail view of a portion of the electronic device in region 2B-2B of FIG. 1.
Figure 2C:
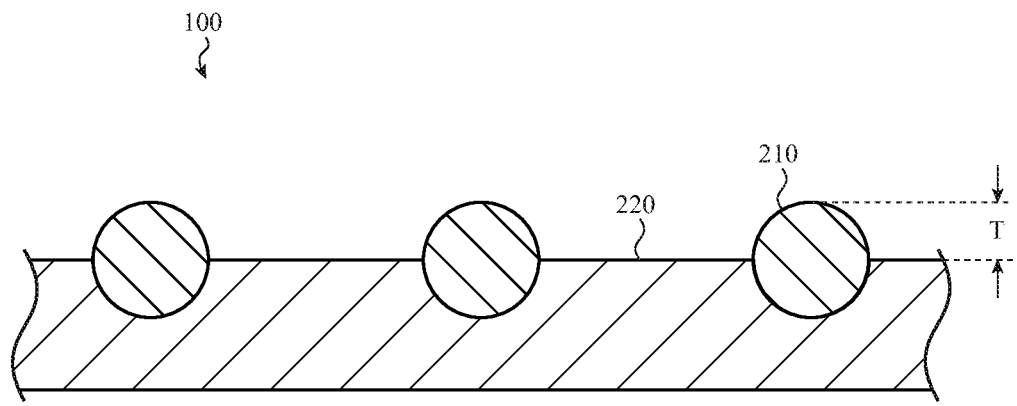
FIG. 2C shows a cross-sectional view of a housing of the device of FIG. 1 viewed along line 2C-2C in FIG. 2B, showing example abrasion-resistant members embedded in the housing of the electronic device.

FIG. 2B is a detail view of the area of the device 100 indicated by line 2B in FIG. 2A, showing the substrate 220 and the abrasion-resistant members 210. The abrasion-resistant members 210, or the portion of the abrasion-resistant members 210 extending above the surface of the substrate 220, may be substantially spherical. For example, the housing may include, embedded in the substrate, spheres of one or more materials (e.g., abrasion-resistant members) that are substantially harder than the material of the substrate. The abrasion-resistant members 210 may have shapes other than spheres, such as cubes, octahedrons, tetrahedrons, dodecahedrons, icosahedrons, cuboids, triangular prisms, pyramidal prisms, cones, or any other suitable regular or irregular shape. The abrasion-resistant members may protrude from the housing surface 220 a distance above the surface of the substrate 220 (as shown in FIG. 2C).

The abrasion-resistant members 210 may be porous. The porous abrasion-resistant members may be produced by any suitable technique, including drilling, etching, additive manufacturing, or any other suitable process (including natural processes, such as where a naturally porous material, such as pumice, is used for the abrasion-resistant members 210). The sizes of the pores may be from about 10 nm to about 1,000 nm, or any other suitable size. The structure of the porous members may be lattice-like or an open-cell structure. The pores may act as interlocking members or structures, permitting the moldable material to mechanically engage with the pores of the porous abrasion-resistant members 210. The interlocking structures are described in detail below.

FIG. 2C is cross sectional view of the device 100, viewed along the line 2C-2C in FIG. 2B. In this embodiment of the invention, the abrasion-resistant members 210 are spherical and are at least partially embedded in the substrate 220. The top of the members 210 extend a distance T above the substrate 220. Depending on the specific application, and composition of the abrasion-resistant members 210 and the composition of the substrate 220, the distance T from the top of the sphere (e.g., abrasion-resistant member) to the surface of the substrate 220 may be between about 0.1 mm and about 3.0 mm, between about 0.2 mm and about 1.5 mm, or between about 0.3 and about 0.6 mm.

The distance T from the top of the sphere, or bead (e.g., abrasion-resistant member) forming the protrusion on the surface of the substrate 220 may be varied from one region to another region. By varying the height of the protrusions, it may be possible to create tactile differences over the surface of the substrate. In some embodiments, it may be possible to feel the tactile differences when it is difficult to visually see the differences in height of the protrusions (with an unaided eye). For example, in some embodiments, it may desirable to provide a first region containing or outlining a logo, indicia, number, or the like with a height of the protrusions having a first distance $T_1$, and provide a second region with a height of the protrusions having a second distance $T_2$, and so on. The variations in height of the protrusions may be used to indicate input regions (e.g., buttons, keys, fingerprint sensors, or the like) of the device, which may be enabled by or include components embedded in the substrate 220 or below the substrate 220 (e.g., within an inner volume defined by the housing).

In some embodiments, some of the abrasion-resistant members may be below the surface of the substrate 220. For example, some abrasion-resistant members may protrude above the surface of the substrate, while others may be positioned entirely below the surface of the substrate 220. The submerged abrasion-resistant members may convey added strength to the substrate.

The abrasion-resistant members 210 may be beads manufactured from metal, glass, ceramic, or hard plastic. The abrasion-resistant members 210 may have non-spherical shapes. They may also have a substantially spherical portion that extends above the substrate surface 120, but may have non-spherical portions embedded below the substrate surface 220. For example, the abrasion-resistant members may include interlocking structures as described herein.

Figure 3A:
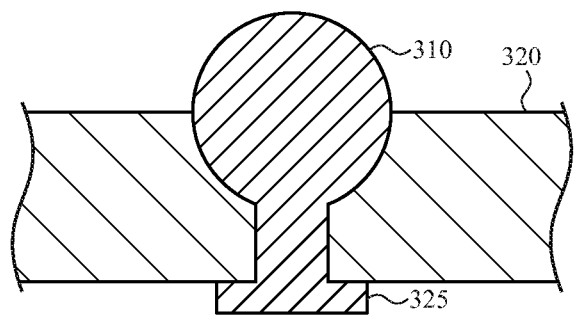
FIG. 3A shows a cross-sectional view of the device of FIG. 1, viewed along line 2C-2C in FIG. 2B, illustrating an example of abrasion-resistant members having an interlocking structure that extends beyond the bottom of the substrate.
Figure 3B:
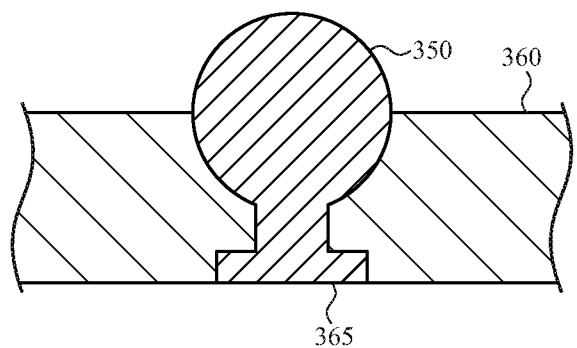
FIG. 3B shows a cross-sectional view of the device of FIG. 1, viewed along line 2C-2C in FIG. 2B, illustrating an example of abrasion-resistant members having an interlocking structure that extends to the bottom of the substrate.
Figure 3C:
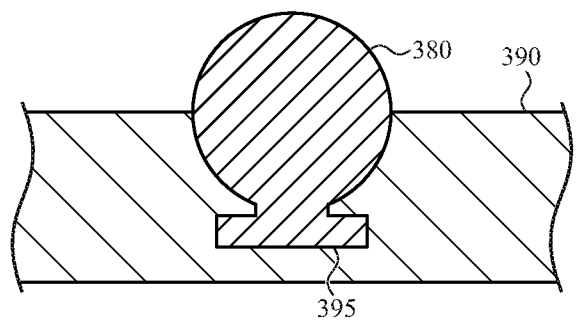
FIG. 3C shows a cross-sectional view of the device of FIG. 1, viewed along line 2C-2C in FIG. 2B, illustrating an example of abrasion-resistant members having an interlocking structure that is positioned within the substrate.

FIGS. 3A-3C illustrate several examples of abrasion-resistant members having interlocking structures. The housing may be fabricated with abrasion-resistant members by disposing abrasion-resistant members with interlocking structures in a moldable material with at least a portion of each of the abrasion-resistant members extending above the surface of the material. For example, the abrasion-resistant members having the interlocking structures may be positioned within a mold, whereupon the moldable material is introduced into the mold to form the housing. The moldable material is cured around and/or through the interlocking structures of the members, thereby retaining the abrasion-resistant members 210 to the moldable material and thus the housing. Alternatively, the abrasion-resistant members 210 may be interlocked with the housing after the housing is formed and/or cured. For example, the abrasion-resistant members 210 may be riveted, bonded, swaged, heat staked, or otherwise attached to a substantially rigid (e.g., cured) housing material.

FIG. 3A shows an abrasion-resistant member 310 with an interlocking structure 325 (e.g., feature) embedded in a substrate 320 (which may correspond to the substrate 220). The interlocking structure 325 extends (e.g., protrudes) beyond the bottom of the substrate 320, such that a portion of the abrasion-resistant members 325 locks onto (e.g., engages with) the bottom of the substrate. The interlocking structure 325 may be or may resemble a post-formed rivet. For example, the abrasion-resistant member 310 may include a bead portion (which may be spherical or any other suitable shape) and a rivet portion (e.g., a rod or post) extending from the bead portion. The rivet portion may be extended through an opening in the housing and then deformed to form the interlocking structure 325. Alternatively, the abrasion-resistant member 310 may be formed as shown in FIG. 3A, and the material of the substrate 320 may be flowed around at least part of the abrasion-resistant member 310 such that the substrate 320 overlaps the interlocking structure 325 as shown in FIG. 3A.

FIG. 3B illustrates another example of an abrasion-resistant member 350 with an interlocking member 365 that extends to (e.g., is substantially flush with) the bottom of the substrate 360 (which may correspond to the substrate 220). The interlocking member 365 of the abrasion-resistant member 350 may be a post-formed rivet, as described above (e.g., where the interlocking member 365 is formed by deforming the abrasion-resistant member 350 to form the interlocking member 365 after being assembled with the substrate 360). Alternatively, the interlocking member 365 may be formed prior to being incorporated with the substrate 360, such as where the abrasion-resistant member 350 is insert-molded with the substrate 360.

FIG. 3C illustrates an abrasion-resistant member 380 with an interlocking structure 395 that is positioned within the substrate 390 (which may correspond to the substrate 220). More particularly, the interlocking structure 395 may not be exposed on an inner surface of the substrate 390. The abrasion-resistant member 380 may be incorporated with the material of the substrate 390 by insert molding, as described herein.

The interlocking structures illustrated in FIGS. 3A-3C are non-limiting examples of interlocking structures that can provide mechanical engagement with the substrate. Other interlocking structures may include dovetails, protrusions, holes, fins, threads, or the like.

Figure 4A:
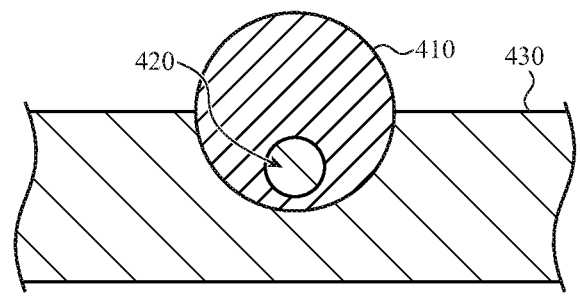
FIG. 4A shows a cross-sectional view of the device of FIG. 1, viewed along line 2C-2C in FIG. 2B, illustrating an example of a substantially spherical abrasion-resistant member with an interlocking structure embedded in a substrate.
Figure 4B:
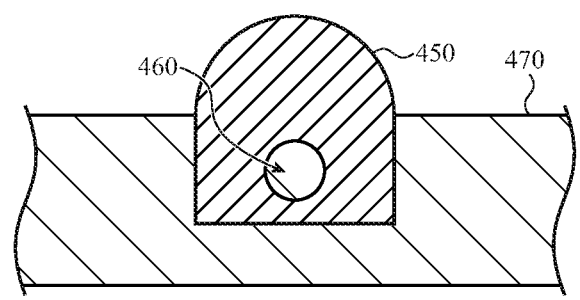
FIG. 4B shows a cross-sectional view of the device of FIG. 1, viewed along line 2C-2C in FIG. 2B, illustrating an example of a non-spherical (e.g., bullet-shaped) embodiment of an abrasion-resistant member with a hole as an interlocking structure.

FIGS. 4A and 4B illustrate additional non-limiting examples of abrasion-resistant members having interlocking structures. More particularly, the interlocking structures in the abrasion-resistant members illustrated in FIGS. 4A and 4B include holes that extend into or through the abrasion-resistant members. In some embodiments, the moldable material of the housing is in, through, and/or around the interlocking structures, thus securing the members to the housing, or enclosure.

FIG. 4A shows a substantially spherical abrasion-resistant member 410 with an interlocking structure 420 embedded in a substrate 430 (which may correspond to the substrate 220). As illustrated in FIG. 4A, the abrasion-resistant member may be an insert-molded sphere or bead 410 with a through-hole 420. FIG. 4B shows a non-spherical (e.g., bullet-shaped) embodiment of an abrasion-resistant member 450 with a hole 460 as an interlocking structure. The substrates 430 and 470 in FIGS. 4A and 4B, respectively, are interlocked through the holes in the members. For example, the abrasion-resistant members 410, 450 may be positioned in a mold or die, and the material for the substrates 430, 470 (which forms structural walls of an electronic device housing) is introduced into the mold such that it extends into and/or through the holes. In some cases, the molding process may be performed in a vacuum environment to allow the material to flow into and/or through the holes without trapping air in the holes.

The abrasion-resistant member 450 illustrates an embodiment where the abrasion-resistant member 450 has a substantially spherical portion above the substrate 470 with a non-spherical portion below an exterior surface of the substrate 470 and mechanically engaged with the substrate. Engagement features such as undercuts may be included in the abrasion-resistant members instead of or in addition to the holes shown in FIGS. 4A-4B.

Figure 5:
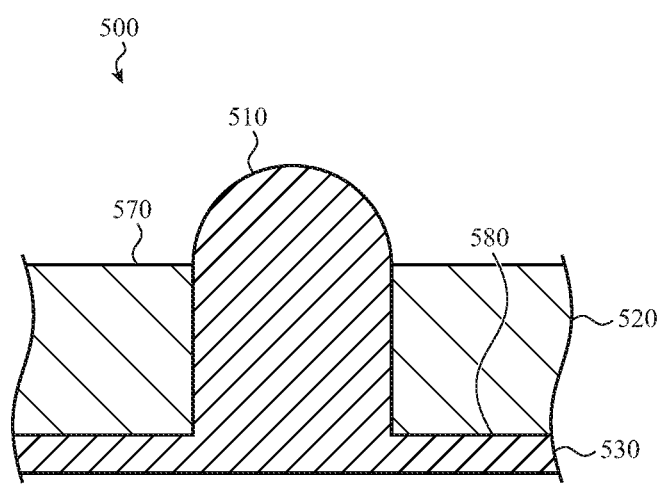
FIG. 5 illustrates an embodiment of an electronic device housing wherein the abrasion-resistant member has an interlocking feature that extends along the bottom of the substrate.

FIG. 5 illustrates an embodiment of an electronic device housing 500 wherein the abrasion-resistant member 510 has an interlocking feature 530 that extends along the bottom of the substrate 520 (which may correspond to the substrate 220). The moldable material (e.g., substrate) is disposed above the interlocking feature 530, and the abrasion-resistant member protrudes above the substrate surface 570. In this embodiment, the inner surface of the housing is substantially defined by the interlocking feature 530 of the abrasion-resistant member 510. The material comprising the abrasion-resistant member 510 and interlocking feature 530 may be harder than the material comprising the moldable material of the substrate 520. For example, the abrasion-resistant material may be formed of or include metal, glass, hard plastic, or ceramic such as zirconia, alumina, silicon carbide, yttria, silicon nitride, or the like. The moldable material may be a polymer, amorphous metal, bulk metallic glass, glass, plastic, acrylic, ultraviolet-cured resin, or any other suitable material.

Several methods could be used to fabricate electronic device housing 500. One method to fabricate the housing 500 may include forming the abrasion-resistant member 510 and interlocking feature 530 in a mold, such that the interlocking feature 530 forms a contiguous surface 580. Subsequent to the forming of the abrasion-resistant member 510, the moldable material of the substrate may be introduced onto the contiguous surface 580 of the interlocking feature 530, such that a portion of the abrasion-resistant member 510 protrudes above the substrate surface 570. This method can be performed with molds, such as in an injection molding process.

Figure 6A:
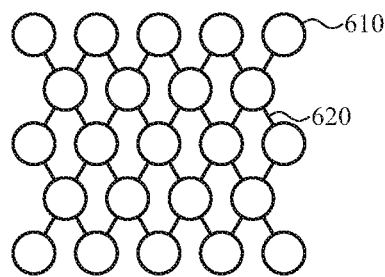
FIG. 6A shows a top view of the interconnected abrasion-resistant members joined by connectors prior to being embedded in the substrate.
Figure 6B:
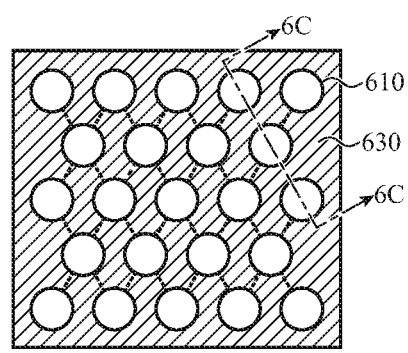
FIG. 6B shows a top view of the interconnected abrasion-resistant members embedded in the substrate.
Figure 6C:
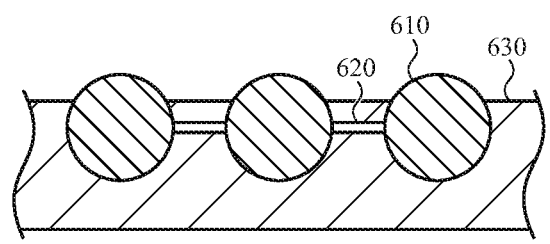
FIG. 6C shows a partial cross-sectional view of the housing shown in 6B viewed along line 6C-6C in FIG. 6B, illustrating a portion of interconnected abrasion-resistant members extending above the surface of substrate, and the connectors below the surface of substrate.

FIGS. 6A-6C illustrate an embodiment of the abrasion-resistant housing with interconnected abrasion-resistant members 610. FIG. 6A shows a top view of the interconnected abrasion-resistant members 610 joined by connectors 620 prior to being embedded in the substrate. FIG. 6B shows a top view of the interconnected abrasion-resistant members 610 embedded in the substrate 630 (which may correspond to the substrate 220). A portion of the surface of the interconnected abrasion-resistant members 610 is above the surface of the substrate 630, and the connectors 620 are below the surface of the substrate 630. For example, FIG. 6C shows a partial cross-sectional view of the housing shown in 6B viewed along line 6C-6C in FIG. 6B, illustrating a portion of interconnected abrasion-resistant members 610 extending above the surface of substrate 630, and the connectors 620 below the surface of substrate 630. The interconnected abrasion-resistant member 610 and connector 620 may be formed from or include an abrasion-resistant material, such as metal, amorphous metal (e.g., bulk metallic glass), ceramic, glass, or hard plastic. The interconnected abrasion-resistant members 610 and connectors 620 may be fabricated by molding, pressing, additive manufacturing (e.g., 3D printing), machining, or any like process. The substrate 630 may be made of a moldable material such as a polymer, amorphous metal, glass, plastic, acrylic, ultraviolet-cured resin, or any other suitable material.

The incorporation of the connectors 620 may increase the stiffness of the housing, serving as a structural reinforcement within the substrate. The thickness and length of the connectors 620 may be designed to tailor the rigidity of the housing.

The interconnected abrasion-resistant members 610 may further comprise interlocking structures (not shown in FIG. 6C), such as any of the interlocking structures shown or described herein (e.g., holes, dovetails, threads, flanges, etc.). The interlocking structures may extend partially into the moldable (e.g., substrate) material, to the bottom of the moldable material, or may extend all the way through the moldable material and protrude through the bottom surface, as illustrated in FIGS. 3A-3C.

Figure 7A:
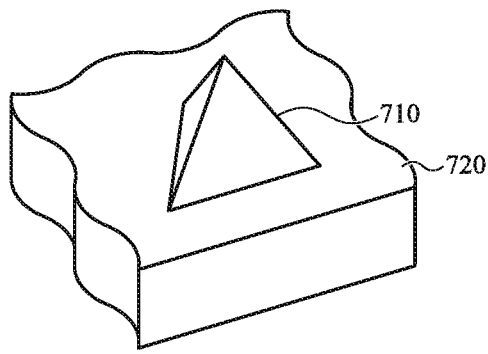
FIG. 7A illustrates a three-sided pyramidal faceted abrasion-resistant structure and the substrate surface.
Figure 7B:
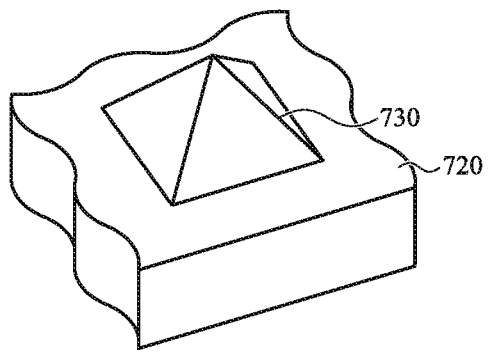
FIG. 7B illustrates a four-sided pyramidal faceted abrasion-resistant structure and the substrate surface.
Figure 7C:
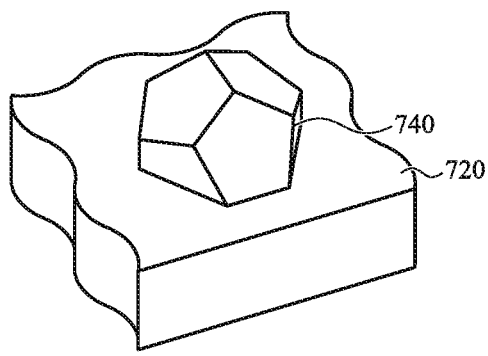
FIG. 7C illustrates a dodecahedron- or icosahedron-shaped abrasion-resistant member may be embedded at least partially in the substrate.

The abrasion-resistant components may be treated or configured to create various optical effects, such as to produce a different appearance when the housing is viewed from different angles. For example, facets could be fashioned in the exposed surfaces of the members. FIGS. 7A-7C illustrate non-limiting embodiments of faceted abrasion-resistant members (e.g., components). The members may be multifaceted such that the exposed portions have 3, 4, 5, 6, or any number of sides to achieve the desired optical effect. FIG. 7A illustrates a three-sided pyramidal faceted structure 710 and the substrate surface 720. FIG. 7B illustrates a four-sided pyramidal faceted structure 730 and the substrate surface 720.

The faceted abrasion-resistant components are not limited to pyramidal structures. Non-pyramidal geometrical shapes may be used in the faceted abrasion-resistant members. For example, abrasion-resistant components that otherwise have spherical or semi-spherical exposed regions may have one (or more) substantially flat facets formed on the exposed surface. As another example, as shown in FIG. 7C, dodecahedron- or icosahedron-shaped abrasion-resistant members 740 may be embedded at least partially in the substrate 720. As the number of facets on the abrasion-resistant members increases, the precision with which the abrasion-resistant members must be positioned may decrease. For example, where an icosahedron-shaped abrasion-resistant member is used, the maximum deviation in positioning (e.g., rotational alignment) of any two members may be limited due to the shape and symmetry of the icosahedron.

The facets in the abrasion-resistant components may be fabricated after formation of the housing, from components that were substantially spherical (or any other suitable shape) prior to being disposed in the substrate. The facets may be formed by treating the abrasion-resistant components with grinders, polishers, chemical etchants, and lasers. For example, the faceted abrasion-resistant components in FIGS. 7A-7C may be fabricated after formation of the housing.

In some embodiments, the portion of the abrasion-resistant member protruding above the substrate surface may be spherical. It may be desirable to form a single facet in each of the members such that they all align to create a specular reflection or other optical or visual appearance that is visible from at least one orientation (e.g., the optical or visible appearance or effect may be visible when a device or surface of the device is viewed from some angles or orientations but not from others). In some cases, an optical or visible appearance or effect may be visible when a device or surface is viewed from any angle or orientation.

In some embodiments, the facets may be fabricated by ablating each member to create an arrangement of the facets. Optical effects, such as a specular reflection, could be achieved by having at least one treated (e.g., faceted) surface on each abrasion-resistant member (or a subset of abrasion-resistant members) aligned to face in substantially the same direction. Alternate embodiments may include having un-aligned facets that may provide a glittery or sparkling appearance. Other optical or visual appearances that may be achieved using faceted members include an image, a hologram, a lenticular image (e.g., a transforming, animated, or stereoscopic image), or the like.

Furthermore, in embodiments it may be preferable to utilize pre-faceted abrasion-resistant components. The abrasion-resistant component may be substantially bead-like. In embodiments, non-spherical abrasion-resistant preformed beads may be incorporated into the housings. An example of a preformed bead 740 is presented in FIG. 7C, where a dodecahedron is incorporated into a housing structure. In embodiments, beads with any number of facets may be incorporated in the housing structure. The abrasion-resistant members, or beads, may be egg shaped (e.g., ovoid). The beads may be rectangular with or without rounded corners and/or side edges. In some embodiments, the shape of the bead and its corresponding weight distribution may cause the bead to align preferentially in the moldable material (e.g., matrix). For example, the bead may be heavier or denser on one end, such that bead naturally orients itself with the heavier or denser end pointing down (e.g., aligned with gravity).

Figure 8:
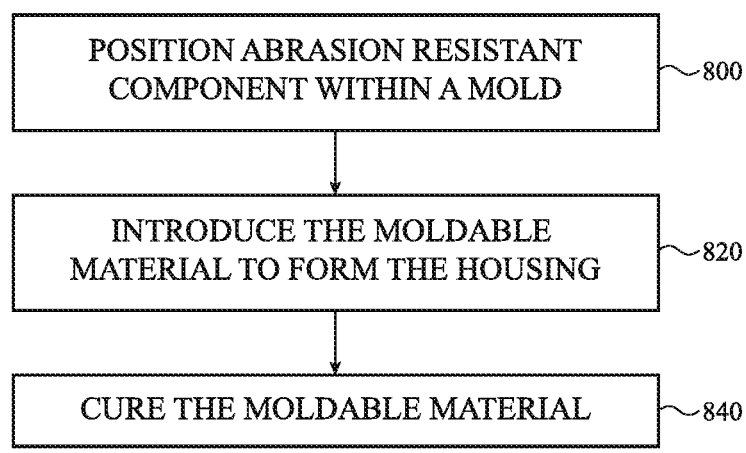
FIG. 8 shows an example process of forming an electronic housing.

FIG. 8 illustrates an example process for forming a housing for an electronic device, such as the housing 100 illustrated in FIG. 1. In operation 800, abrasion-resistant components are positioned within a shaped mold that defines at least one contour, recess, protrusion, or the like. The positioning can be performed by hand, as well as by robotic processes. The abrasion-resistant members may include interlocking features (e.g., as described with respect to FIGS. 3A-5), connectors that join the abrasion-resistant members (e.g., as described with respect to FIGS. 7A-7C), or they may be free of interlocking structures or features.

In operation 820, moldable material is introduced into the mold to form the housing. For example, the moldable material is raised above a melting/softening temperature and introduced (e.g., poured, flowed, and/or injected) into the mold. As the moldable material is introduced into the mold, it may flow around portions of the abrasion-resistant components, as well as any interlocking structures or connectors of the abrasion-resistant components. Accordingly, once cured or hardened, the moldable material will be engaged with the abrasion-resistant components, interlocking structures, and/or connectors, thus retaining the abrasion-resistant components to the cured or hardened material.

The moldable materials may include polymers, glasses, amorphous metals, or the like. Polymers may be thermosetting resins, thermoplastics, acrylics, and the like. The amorphous metals can include bulk metallic glasses and low melting metallic alloys.

In operation 840, the moldable material is cured. For example, polymer moldable material may be cured by electron beams, heat, ultraviolet radiation, or chemical additives. As another example, an amorphous alloy may be used as the moldable material. In this example, the curing is achieved by cooling the amorphous alloy.

Figure 9A:
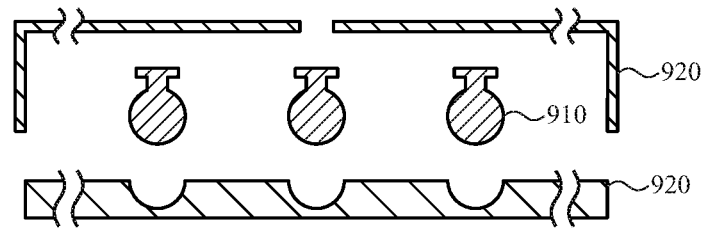
FIG. 9A shows abrasion-resistant components having interlocking structures positioned over a mold.

FIGS. 9A-9D illustrate a method for producing an abrasion-resistant housing. FIG. 9A shows abrasion-resistant components 910 having interlocking structures positioned over a mold 920. The abrasion-resistant components 910 may be positioned by a variety of positioning methods, including by hand, by robotic methods, and the like.

In embodiments, it may be desirable to use interconnected abrasion-resistant components, or substantially spherical or bead-like abrasion-resistant components free of interlocking structures, or features.

Figure 9B:
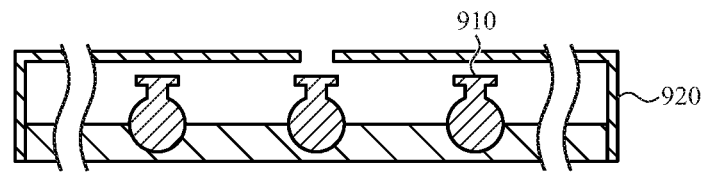
FIG. 9B shows abrasion-resistant components having interlocking structures positioned within the mold.

In FIG. 9B, the abrasion-resistant components having interlocking structures are positioned within the mold 920. The mold 920 may include recesses, contours, or other features or shapes that receive and hold the abrasion-resistant members 910 in place. In some cases, the abrasion-resistant members 910 may be adhered, bonded, magnetically secured, mechanically secured (e.g., clamped), or otherwise retained to the mold 920 to prevent them from becoming displaced or moved during injection of the material (described below). The mold may be an injection mold or any other suitable mold or die.

Figure 9C:
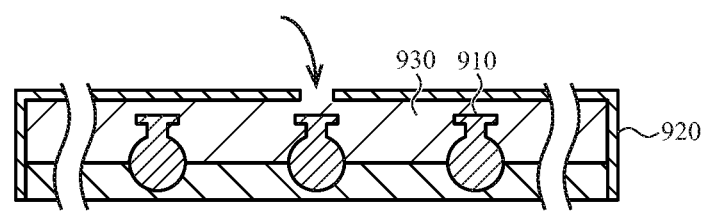
FIG. 9C shows moldable material being introduced into the mold to form the housing.

In FIG. 9C, the moldable material 930 is introduced into the mold to form the housing. The moldable material 930 may be introduced into the mold by nozzle. The nozzles may use a modular design that offers the ability to inject more than one component at flow rates that optimize the distribution of the moldable material.

Figure 9D:
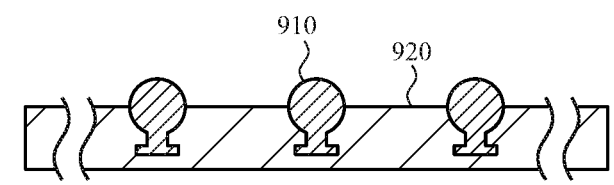
FIG. 9D shows an example of an abrasion-resistant housing produced by the described method.

In FIG. 9D, the abrasion-resistant housing produced by the described method is shown. As shown in FIG. 9D, the abrasion-resistant members have interlocking features mechanically engaged with the material of the substrate in the midst of the moldable material. In embodiments, the abrasion-resistant members may have interlocking features that reach to the bottom of the substrate (as illustrated in FIG. 3B), or may extend beyond the bottom of the substrate and lock onto the back of the housing (as illustrated in FIG. 3C).

In the forgoing examples of housings, the shape of the abrasion-resistant members 210 prior to being incorporated into the material of the housing may be maintained in the completed housing. In some cases, however it may be desirable to impart a shape to the abrasion-resistant members 210 after an abrasion-resistant material or precursor is integrated with a substrate material.

Figure 10A:
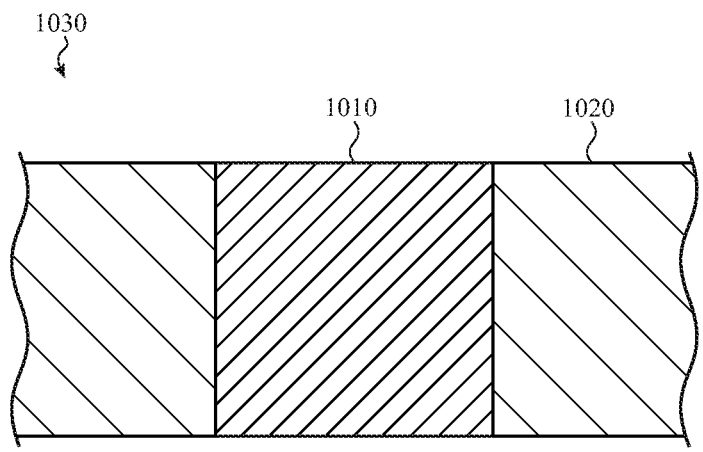
FIG. 10A shows cross-sectional view of the device of FIG. 1, viewed along line 2C-2C in FIG. 2B, illustrating a combination of a first material and a second material that align flush along a top surface.
Figure 10B:
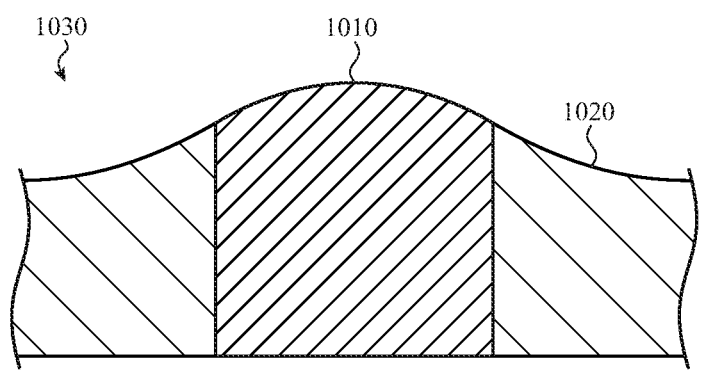
FIG. 10B shows a cross-sectional view of the device of FIG. 1, viewed along line 2C-2C in FIG. 2B, illustrating a combination of materials such that the second material is differentially relieved relative to the first material.

FIGS. 10A-10B illustrate an embodiment of forming an abrasion-resistant housing in which an abrasion-resistant material is formed or processed after integration with a matrix material. For example, FIG. 10A shows a combination of a first material 1010 and a second material 1020 that align flush along a top surface 1030. The first material 1010 has a higher hardness value than the second material 1020. The combination of materials can be polished such that the second material 1020 is differentially relieved relative to the first material 1010, as illustrated in FIG. 10B. The polishing of the combination material results in a textured housing surface such that the first material forms the abrasion-resistant member in the housing structure. The combination of a first material 1010 and a second material 1020 may be produced by pressing and/or fusing the first and second materials together, or by inserting abrasion-resistant materials and/or members into a mold and then flowing the second material 1020 around the abrasion-resistant materials and/or members, as described with respect to FIGS. 9A-9D, for example.

Housings with abrasion-resistant members 210 may furthermore include embodiments in which the abrasion-resistant members 210 are incorporated into the housings after the substrate is formed. For example, abrasion-resistant members 210 may be fabricated by spot-welding metal abrasion-resistant members 210 on the substrate. A welder may be used to apply spot-welds at a desirable surface density. Furthermore, the size and shape of the welded abrasion-resistant member 210 may be controlled by the parameters of the welding apparatus.

In an embodiment, the abrasion-resistant member 210 may be incorporated into the substrate using selective laser melting (SLM), wherein the abrasion-resistant members 210 are built up one layer at a time (each layer being as small as 1 atom in thickness). Using SLM, an array of the abrasion-resistant members 210 may be fabricated at a desired diameter, height, and surface density.

While the present disclosure has been described with reference to various examples, it will be understood that these examples are illustrative and that the scope of the disclosure is not limited to them. Many variations, modifications, additions, and improvements are possible. More generally, examples in accordance with the present disclosure have been described in the context or particular embodiments. Functionality may be separated or combined in blocks differently in various embodiments of the disclosure or described with different terminology. These and other variations, modifications, additions, and improvements may fall within the scope of the disclosure as defined in the claims that follow The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings. For example, while the methods or processes disclosed herein have been described and shown with reference to particular operations performed in a particular order, these operations may be combined, subdivided, or re-ordered to form equivalent methods or processes without departing from the teachings of the present disclosure. Moreover, structures, features, components, materials, steps, processes, or the like, that are described herein with respect to one embodiment may be omitted from that embodiment or incorporated into other embodiments.

What is claimed is:

1. A housing of an electronic device, comprising:
    a monolithic substrate formed of a moldable polymer material having a uniform composition and defining:
        an external surface and an internal surface of the housing;
        a back panel; and
        a set of sidewalls extending from the back panel and defining a curved corner portion of the monolithic substrate; and
    a plurality of members bonded directly to the monolithic substrate in respective recesses defined in the monolithic substrate, the plurality of members protruding from the external surface and having a hardness greater than a hardness of the monolithic substrate, the plurality of members comprising:

a first set of members protruding from the external surface along the curved corner portion, the first set of members defining a first surface density, each member of the first set of members retained to the monolithic substrate at least in part by a respective undercut defined by the monolithic substrate and in contact with a surface of the member of the first set; and a second set of members protruding from the external surface along the back panel, the second set of members defining a second surface density, less than the first surface density, and each member of the second set of members retained to the monolithic substrate at least in part by a respective undercut defined by the monolithic substrate and in contact with a surface of the member of the second set.

2. The housing of claim 1, wherein an average distance between adjacent members of the first set of members is between about 10 and 100 microns.

3. The housing of claim 1, wherein:
the members of the plurality of members each have a faceted surface; and
the members of the plurality of members are each configured to reflect light at an angle.

4. The housing of claim 1, wherein the monolithic substrate has a Young's modulus greater than or equal to about 5 GPa.

5. The housing of claim 1, wherein the members of the plurality of members each have a diameter between about 0.5 and about 5.0 mm.

6. A housing of an electronic device, comprising:
a unitary housing structure formed from a single moldable material and defining:
a back wall of the housing defining a flat portion of an external surface of the housing; and
at least one side wall extending from the back wall and defining a curved portion of the external surface;
a first set of members having first interlocking features and being at least partially embedded in the unitary housing structure such that the first interlocking features mechanically engage first undercuts defined in the single moldable material of the unitary housing structure, the members of the first set positioned in the at least one side wall, defining a first surface density, and each having a portion protruding above the curved portion of the external surface; and
a second set of members having second interlocking features and being at least partially embedded in the unitary housing structure such that the second interlocking features mechanically engage second undercuts defined in the single moldable material of the unitary housing structure, the members of the second set positioned in the back wall, defining a second surface density less than the first surface density, and each having a portion protruding above the flat portion of the external surface of the back wall, and each member of the first and the second sets of members having a hardness value greater than a hardness value of the single moldable material.

7. The housing of claim 6, wherein the single moldable material has a Young's modulus greater than or equal to 2 GPa.

8. The housing of claim 7, wherein the single moldable material is a polymer.

9. The housing of claim 7, wherein the single moldable material is an amorphous metal.

10. The housing of claim 6, wherein each member of the second set of members has a faceted surface, such that a region of the back wall including the second set of members produces a specular reflection.

11. The housing of claim 6, wherein the first and the second interlocking features comprise flanges.

12. The housing of claim 6, wherein:
the second set of members is positioned in a first region of the back wall;
a second region of the back wall is substantially free of members; and
the second region of the back wall corresponds to a location of an antenna within the housing.

13. The housing of claim 6 further comprising connecting elements joining at least a subset of the members of the second set of members to one another.

14. The housing of claim 13, wherein the subset of the members of the second set of members and the connecting elements are a monolithic structure.

15. The housing of claim 6, wherein the members of the second set of members are distributed in a regular pattern over the flat portion of the external surface of the back wall.

* * * * *